United States Patent [19]

Serita

[11] Patent Number: 5,142,233
[45] Date of Patent: Aug. 25, 1992

[54] TUNING DEVICE WITH BATTERY CONDITION DISPLAY

[75] Inventor: Hirokazu Serita, Tokyo, Japan

[73] Assignee: Seiko Instruments, Inc., Tokyo, Japan

[21] Appl. No.: 631,160

[22] Filed: Dec. 20, 1990

[30] Foreign Application Priority Data

Dec. 20, 1989 [JP] Japan .......................... 1-147399[U]

[51] Int. Cl.$^5$ ........................................ G01N 27/416
[52] U.S. Cl. .................................. 324/435; 324/426; 340/636
[58] Field of Search .............. 84/454, 462, 477 R, 84/478, 600; 324/435, 426; 340/636

[56] References Cited

U.S. PATENT DOCUMENTS

| | | | |
|---|---|---|---|
| 2,514,745 | 7/1950 | Dalzell | 324/435 |
| 4,014,167 | 3/1977 | Hasegawa et al. | 84/454 |
| 4,991,484 | 2/1991 | Kawashima | 84/454 |
| 5,027,294 | 6/1991 | Fakruddin et al. | 324/426 |

Primary Examiner—Edward L. Coles, Sr.
Assistant Examiner—Rafael Bacares
Attorney, Agent, or Firm—Spensley Horn Jubas Lubitz

[57] ABSTRACT

A tuning device provided with an A/D conversion circuit receiving a battery voltage as an input and an averaging circuit averaging values obtained through A/D conversion and converting it into display data for display of an averaged voltage value. Therefore, an operator can be informed of the current residual electric energy of a battery even when a reference sound is being produced, and thereby correct operation can be verified.

7 Claims, 1 Drawing Sheet

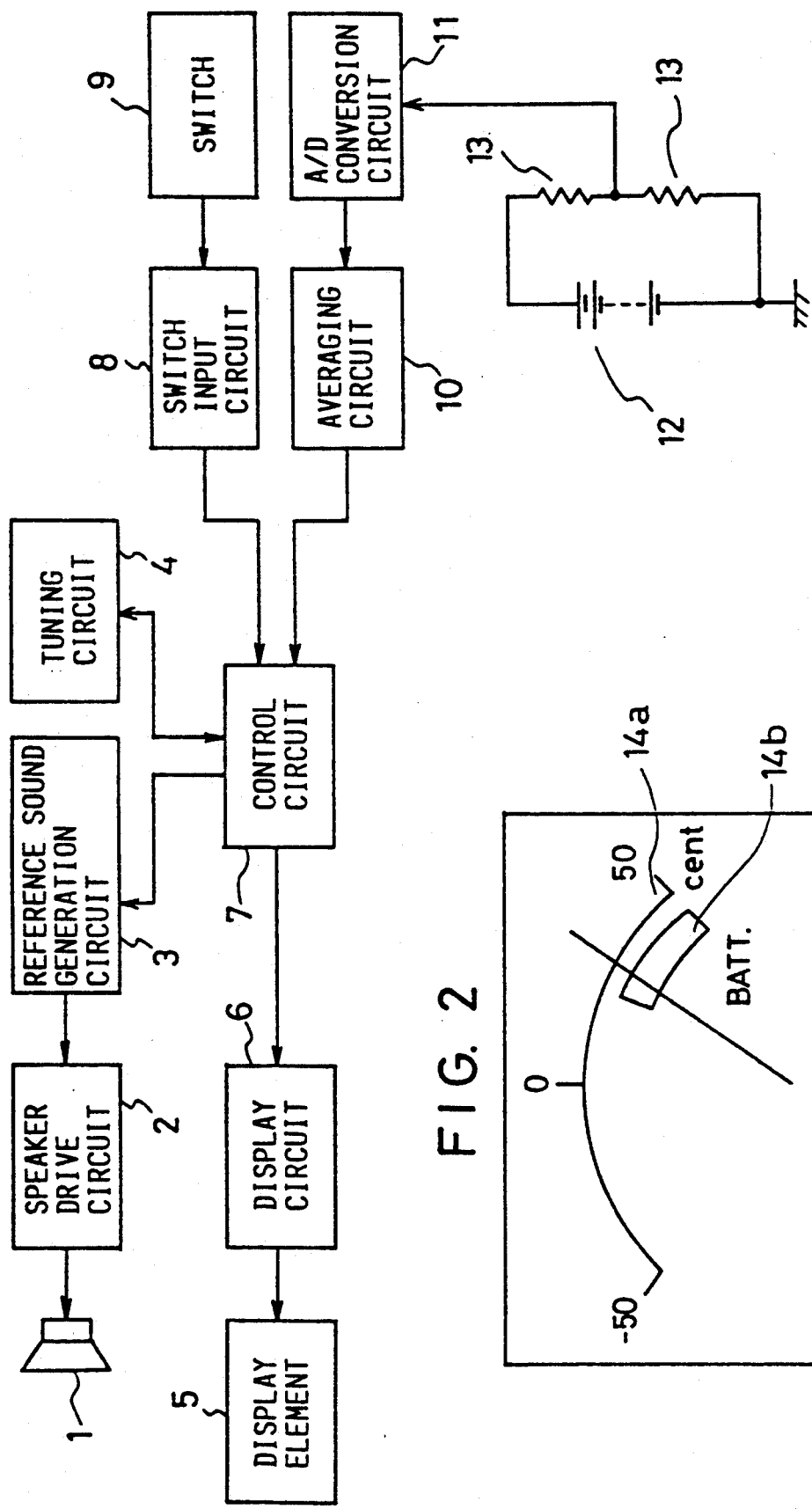

TUNING DEVICE WITH BATTERY CONDITION DISPLAY

BACKGROUND OF THE INVENTION

1. Field of the Invention

The present invention relates to the display of the residual electric energy of a battery of a tuning device which performs a sound-producing function.

2. Prior Art

In a conventional tuning device which displays the charge state of the battery automatically in order to provide a low battery alarm, fluctuations of the current consumed for sound production are large when a reference sound producing mode is selected, and therefore fluctuations of the battery voltage becomes so strong that it is difficult to provide an alarm display by using an IC for voltage detection, A/D conversion, etc. when the voltage drops below a working limit voltage of the battery.

SUMMARY OF THE INVENTION

An object of the present invention is to display the battery voltage in the reference sound producing mode of such a device and thereby to inform the operator of the working limit of the battery.

The present invention is devised so that the battery voltage is displayed to inform an operator of the residual electric energy of the battery when the reference sound producing mode of the tuning device is selected. There is available no display of battery state in the reference sound producing mode with the conventional tuning device, and this brings forth problems that the working limit of the battery is reached unexpectedly, causing a faulty operation of a circuit etc. and this makes it impossible to produce a correct sound, etc.

The above and other objects are achieved, according to the present invention, by a tuning device comprising:

a battery constituting a source of operating power for the device;

averaging means connected to the battery for producing a battery voltage signal representative of the average value of the battery voltage over a selected time interval;

a tuning circuit for computing data identifying a note to be tuned;

a reference sound generating circuit for generating a signal representing a reference sound;

means including a speaker connected to the reference sound generating circuit for producing an audible reference sound corresponding to that represented by the reference sound signal;

switch means operable for selectively providing an indication of one of a tuning mode in which a tuning operation is performed and a reference sound producing mode in which a reference sound is produced, and for providing a designation of the reference sound to be produced by the reference sound generating circuit;

control means connected to the switch means, the averaging means, the tuning circuit and the reference sound generating circuit, the control means being operative for placing the device in a selected one of the tuning mode and the reference sound producing made in response to the mode indication provided by the switch means, for controlling and receiving data from the tuning circuit when the device is in the tuning mode, and for activating the reference sound generating circuit to generate a reference sound signal based on the designation provided by the switch means when the device is in the reference sound producing mode; and display means connected to the control means for providing a display indicating the current state of charge of the battery when the device is in the reference sound producing mode, in response to the battery voltage signal produced by the averaging means.

BRIEF DESCRIPTION OF THE DRAWINGS

FIG. 1 is a block diagram of an embodiment of the present invention.

FIG. 2 is an illustration of an example of a display according to the present invention.

DESCRIPTION OF THE PREFERRED EMBODIMENTS

A detailed description will be made hereunder of the constitution and operation of a device according to the present invention. A block diagram of a tuning device according to the present invention is shown in FIG. 1, and connections and operations thereof will be described on the basis of this diagram.

A speaker 1 is connected to a speaker drive circuit 2 and produces a sound when in a reference sound mode. The speaker drive circuit 2 is connected to a reference sound generating circuit 3, and when the device is in the reference sound mode, circuit 2 amplifies a reference sound signal outputted from the reference sound generating circuit 3 and drives the speaker 1. The reference sound generating circuit 3 is connected to a control circuit 7 which designates the frequency of the sound to be produced when in the reference sound mode, sends an appropriate control signal to reference sound generating circuit 3, and instructs reference sound generating circuit 3 not to produce the sound in any mode other than the reference sound producing mode.

A tuning circuit 4 is of a type usually employed, and it is connected to the control circuit 7 to receive from the control circuit 7 an input signal when the device is to be in a tuning mode. Upon receipt of such a signal, tuning circuit 4 executes a tuning operation and outputs; to the control circuit 7 octave, pitch name and cent deviation information determined by this operation.

A display element 5 is constructed of an LED and a VU meter or a liquid crystal and is connected to a display circuit 6. This display element 5 displays the pitch name and the octave being produced and the residual electric energy of a battery when in the reference sound mode, while displaying the pitch name, octave and cent deviation of a sound to be tuned when in the tuning mode. Display circuit 6 is connected to the control circuit 7 and causes display element 5 to display the data outputted from the control circuit 7.

A switch unit 9 is connected to a switch input circuit 8 and includes a first switch with which an operator selects between the reference sound mode and the tuning mode and a second switch for selecting an octave and a pitch name to be produced in the reference sound mode. The switch input circuit 8 is connected to the control circuit 7 and responds to the switching state of switch unit 9 to output switching state signals to control circuit 7.

An A/D conversion circuit 11 has an input connected to receive a voltage obtained by dividing the voltage of a battery 12 by a voltage divider 13, and circuit 11 outputs a digital representation of the inputted voltage to an averaging circuit 10. The averaging circuit 10 computes a running average of voltage readings received from A/D conversion circuit 11 and outputs the average to the control circuit 7. When the present mode is the reference sound producing mode, control circuit 7 outputs data representing the average voltage value to the display circuit 6. When the present mode is the tuning mode, instead of averaging the voltage data from the A/D conversion circuit 11, circuit 7 compares the individual voltage values with a voltage value at the working limit of the battery as is usually conducted, and outputs an alarm display to the display circuit 6 to indicate the need for replacement of the battery when the working limit is reached.

FIG. 2 shows an example of display according to the present invention.

When the device is in the tuning mode, the tuning cent value is observed on a scale 14a. When the device is in the reference sound producing mode, the remaining battery charge is observed in a battery 14b. When the pointer of a meter is present within the zone 14b, the battery can still be used, and the residual electric energy thereof can be identified by the position of the pointer in the battery zone 14b.

Since the tuning device according to the present invention has the constitution and operation described above, the residual electric energy of the battery can be recognized even when the device is operating in the reference sound producing mode. Since the time of replacement of the battery can be predicted, the ease-of-use is improved and a correct reference sound can be produced.

This application relates to subject matter disclosed in Japanese application No. U1-147399, filed on Dec. 20, 1989, the disclosure of which is incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A tuning device comprising:
   a battery constituting a source of operating power for the device;
   averaging means connected to said battery for producing a battery voltage signal representative of the average value of the battery voltage over a selected time interval;
   a tuning circuit for computing data identifying a note to be tuned;
   a reference sound generating circuit for generating a signal representing a reference sound;
   means including a speaker connected to said reference sound generating circuit for producing an audible reference sound corresponding to that represented by the reference sound signal;
   switch means operable for selectively providing an indication of one of a tuning mode in which a tuning operation is performed and a reference sound producing mode in which a reference sound is produced, and for providing a designation of the reference sound to be produced by said reference sound generating circuit;
   control means connected to said switch means, said averaging means, said tuning circuit and said reference sound generating circuit, said control means being operative for placing said device in a selected one of the tuning mode and the reference sound producing mode in response to the mode indication provided by said switch means, for controlling and receiving data from said tuning circuit when said device is in the tuning mode, and for activating said reference sound generating circuit to generate a reference sound signal based on the designation provided by said switch means when said device is in the reference sound producing mode; and
   display means connected to said control means for providing a display indicating the current state of charge of said battery when said device is in the reference sound producing mode, in response to the battery voltage signal produced by said averaging means.

2. A tuning device as defined in claim 1 wherein said averaging means comprise an analog-digital converter for receiving an analog signal representative of the instantaneous value of the battery voltage and for deriving a digital signal representative of the average value of the battery voltage over a selected time interval.

3. A tuning device as defined in claim 2 wherein said tuning circuit computes the pitch name, octave and cent deviation of a note to be tuned.

4. A tuning device as defined in claim 3 wherein said means including a speaker further comprise a speaker drive circuit connected for amplifying the reference sound signal.

5. A tuning device as defined in claim 1 wherein said display means comprise a display element having a moveable indicator and a first zone across which said indicator is moveable to display the current state of battery charge.

6. A tuning device as defined in claim 5 wherein said display element includes a scale across which said indicator is moveable to display information relating to a signal to be tuned when said device is in the tuning mode.

7. A tuning device as defined in claim 1 wherein said control means are operative for causing said display means to provide the display indicating the current state of charge of said battery only when said device is in the reference sound producing mode.

* * * * *